(12) United States Patent
Huang

(10) Patent No.: US 7,432,168 B1
(45) Date of Patent: Oct. 7, 2008

(54) METHOD FOR FABRICATING SEMICONDUCTOR DEVICE WITH THIN GATE SPACER

(75) Inventor: Yi-Min Huang, Hsinchu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 11/686,980

(22) Filed: Mar. 16, 2007

(51) Int. Cl.
*H01L 21/336* (2006.01)

(52) U.S. Cl. ............... 438/305; 438/304; 438/303; 438/E21.141; 438/E21.248

(58) Field of Classification Search ......... 438/301–305, 438/369, 514
See application file for complete search history.

(56) References Cited

U.S. PATENT DOCUMENTS

| | | | | |
|---|---|---|---|---|
| 5,234,850 A | * | 8/1993 | Liao | 438/231 |
| 5,757,045 A | * | 5/1998 | Tsai et al. | 257/336 |
| 6,124,175 A | * | 9/2000 | Gardner et al. | 438/305 |
| 6,156,615 A | * | 12/2000 | Kepler | 438/305 |
| 6,555,865 B2 | * | 4/2003 | Lee et al. | 257/314 |
| 6,767,835 B1 | * | 7/2004 | Nariman et al. | 438/710 |
| 6,864,143 B1 | * | 3/2005 | Shue et al. | 438/299 |
| 6,913,979 B2 | * | 7/2005 | You et al. | 438/301 |

* cited by examiner

*Primary Examiner*—Dung A. Le
(74) *Attorney, Agent, or Firm*—Thomas, Kayden, Horstemeyer & Risley

(57) ABSTRACT

A method for fabricating a transistor. A substrate having a gate electrode thereon and insulated therefrom is provided. A first gate spacer with a first dielectric material is formed on the sidewalls of the gate electrode. A liner with a second dielectric material is formed on the upper surfaces of the substrate, the first gate spacer and the gate electrode, wherein the first dielectric material has an etching selectivity relative to the second dielectric material. Ion implantation is performed on the substrate to form source/drain regions in the substrate and substantially self-aligned with the liner on the first gate spacer. The liner is removed from the upper surfaces of the gate electrode and the source/drain regions. A method for fabricating a semiconductor device is also disclosed.

19 Claims, 5 Drawing Sheets

METHOD FOR FABRICATING SEMICONDUCTOR DEVICE WITH THIN GATE SPACER

BACKGROUND OF THE INVENTION

1. Field of the Invention

The invention relates to semiconductor technology and in particular to fabrication of a semiconductor device with thin gate spacer capable of increasing spacer merge window while maintaining device performance.

2. Description of the Related Art

In current integrated circuit technology, semiconductor device manufacturers are constantly improving device performance while lowering manufacturing cost. Accordingly, semiconductor device sizes have been continuously reduced so that more devices can be formed on a single chip. However, in reducing device size other factors arise to limit performance. For example, since Metal-Oxide-Metal (MOS) transistors are widely used in semiconductor devices, as the semiconductor devices size is reduced, the gate electrode width, gate-to-gate spacing and gate-to contact spacing are decreased, inducing short channel effect (SCE) and causing gate spacer merge.

Such an adverse effect (i.e. SCE) can result in decreased source-drain break-down voltage, increasing junction parasitic capacitance and unstable threshold voltage and is difficult to control due to source/drain dopant lateral diffusion in reduced device size. Additionally, gate spacer merge results in contact hole failure, such that the integrated circuit is opened.

The gate spacer merge window is limited by the deposition thickness of the film for gate spacer formation. To avoid gate spacer merge, thinner spacers are widely used. However, to control the SCE for the semiconductor device with thinner gate spacer, the source/drain implant energy must be reduced to reduce source/drain dopant lateral diffusion, resulting in reduced source/drain junction depth. In such a case, junction leakage induced by silicide formed on source/drain regions may be aggravated. Accordingly, balance must be struck between source/drain junction depth and gate spacer merge window.

Thus, there exists a need for an improved method for fabricating a semiconductor device to increase gate spacer merge window without SCE degradation.

BRIEF SUMMARY OF INVENTION

A detailed description is given in the following embodiments with reference to the accompanying drawings. Methods for fabricating a transistor and a semiconductor device are provided, respectively. An embodiment of a method for fabricating a transistor comprises providing a substrate having a gate electrode thereon and insulated therefrom. A first gate spacer with a first dielectric material is formed on the sidewalls of the gate electrode. A liner with a second dielectric material is formed on the upper surfaces of the substrate, the first gate spacer and the gate electrode, wherein the first dielectric material has an etching selectivity relative to the second dielectric material. Ion implantation is performed on the substrate to form source/drain regions in the substrate and substantially self-aligned with the liner on the first gate spacer. The liner on the upper surfaces of the gate electrode and the source/drain regions is removed.

An embodiment of a method for fabricating a semiconductor device comprises providing a substrate having at least two conductive line elements thereon and insulated therefrom. First spacers with a first dielectric material are formed on the sidewalls of the conductive line elements, respectively. A liner with a second dielectric material is formed on the upper surfaces of the substrate, the first spacers and the conductive line elements, wherein the first dielectric material has an etching selectivity relative to the second dielectric material. Ion implantation is performed on the substrate to form doped regions in the substrate and substantially self-aligned with the liner on the first spacers, respectively. The liner is removed from the upper surfaces of the conductive line elements and the doped regions.

BRIEF DESCRIPTION OF DRAWINGS

The invention can be more fully understood by reading the subsequent detailed description and examples with references made to the accompanying drawings, wherein:

FIGS. 2E-1 to 2F-1 are cross sections of an embodiment of intermediate steps for fabricating the semiconductor device in FIG. 1.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. An embodiment of a method for fabricating a semiconductor device will be described below with reference to the accompanying drawings.

Figure 1:
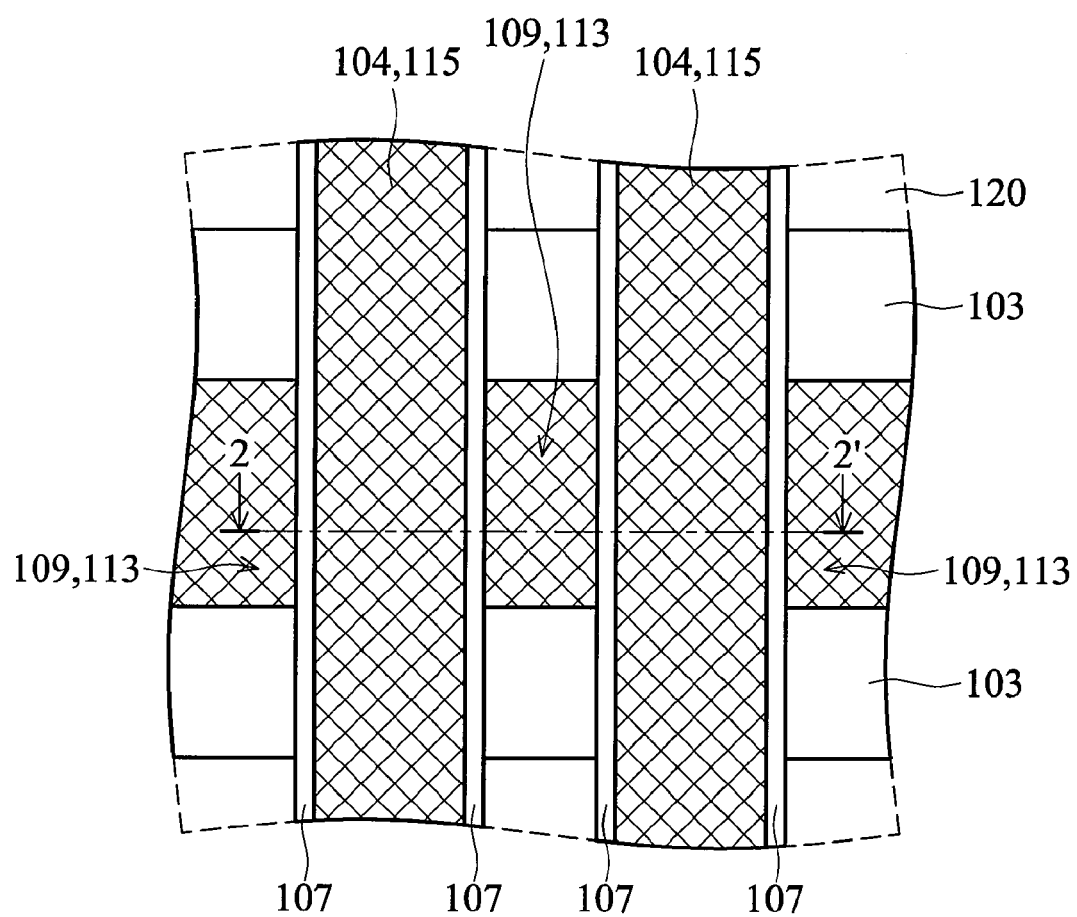
FIG. 1 is a plan view of an embodiment of a semiconductor device including transistors.
Figure 2A:
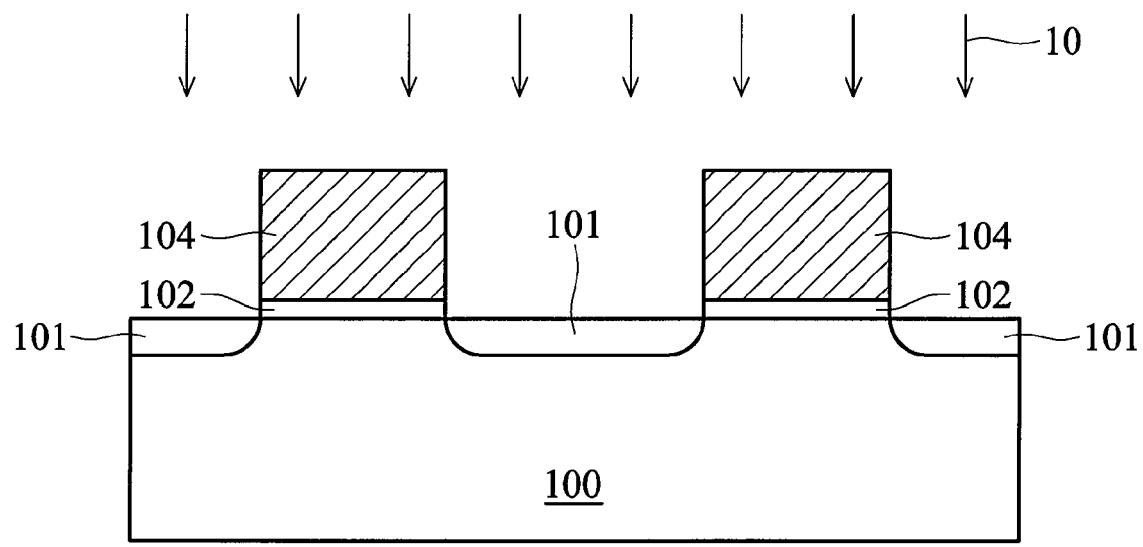
FIGS. 2A to 2F are cross sections of an embodiment of a method for fabricating the semiconductor device in FIG. 1.

The invention relates to an improved method for fabricating a semiconductor device with thin gate spacer. FIG. 1 is a plan view of an embodiment of a semiconductor device including transistors. FIGS. 2A to 2F are cross sections along the line 2-2' shown in FIG. 1, showing an embodiment of a method for fabricating a semiconductor device. In FIG. 2A, a substrate 100, such as a silicon substrate or other semiconductor substrate, is provided. The substrate 100 comprises active regions defined by isolation structure 103, as shown in FIG. 1. The isolation structure 103 may comprise field oxides formed by conventional isolation technologies, such as local oxidation of silicon (LOCOS) or shallow trench isolation (STI). Gate electrodes are formed in the corresponding active regions. To simplify the diagram, only two gate electrodes 104 are depicted. The gate electrode 104 may be considered as a conductive line element, as shown in FIG. 1. For example, the conductive line element 104 may be a word line of a memory device and comprise metal or doped polysilicon. Typically, the gate electrodes 104 are insulated from the substrate 100 by a gate dielectric layer 102. Ion implantation 10 is performed on the substrate 100 using the gate electrodes 104 as an implant mask, to form lightly doped regions 101, such as lightly doped drain (LDD) regions.

Figure 2B:
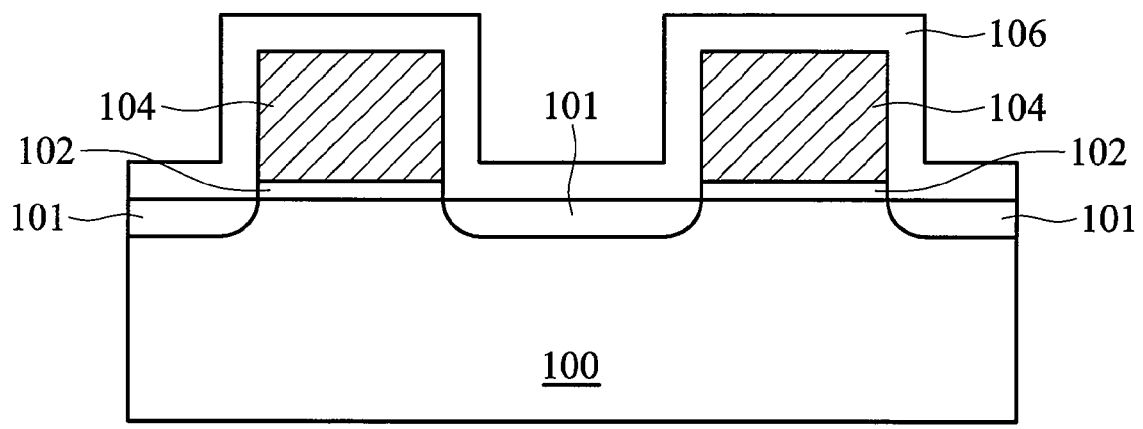
Figure 2C:
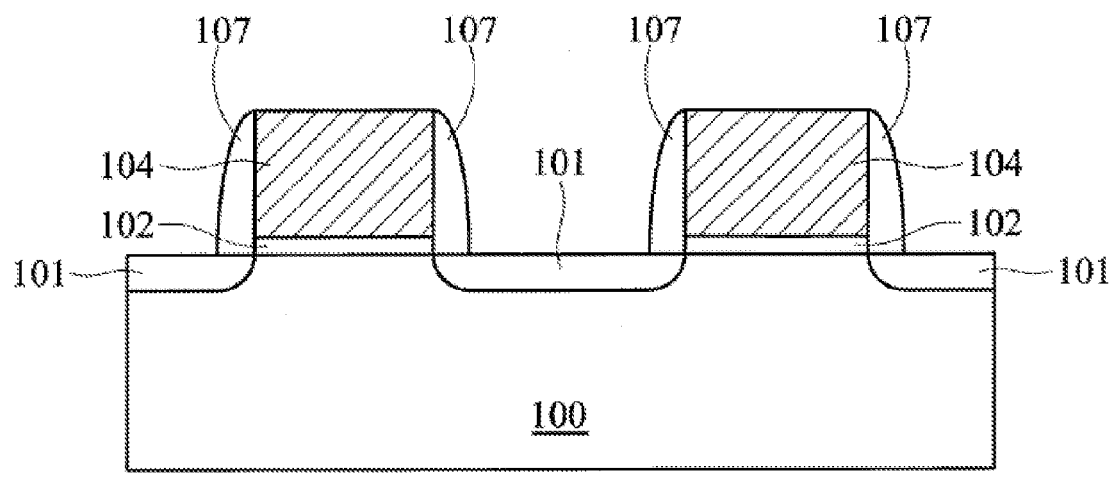

In FIG. 2B, a dielectric layer 106 is conformally deposited over the substrate 100 including the gate electrodes 104. The dielectric layer 106 may comprise silicon oxide, silicon nitride, or silicon oxynitride and be formed by chemical vapor deposition (CVD) or other conventional deposition. Moreover, the dielectric layer 106 has a thickness of about 300 Å to 600 Å. Thereafter, the dielectric layer 106 is anisotropically etched to form gate spacers 107 with a thickness of about 300 Å to 600 Å on the sidewalls of the gate electrodes 104, as shown in FIG. 2C.

Figure 2D:
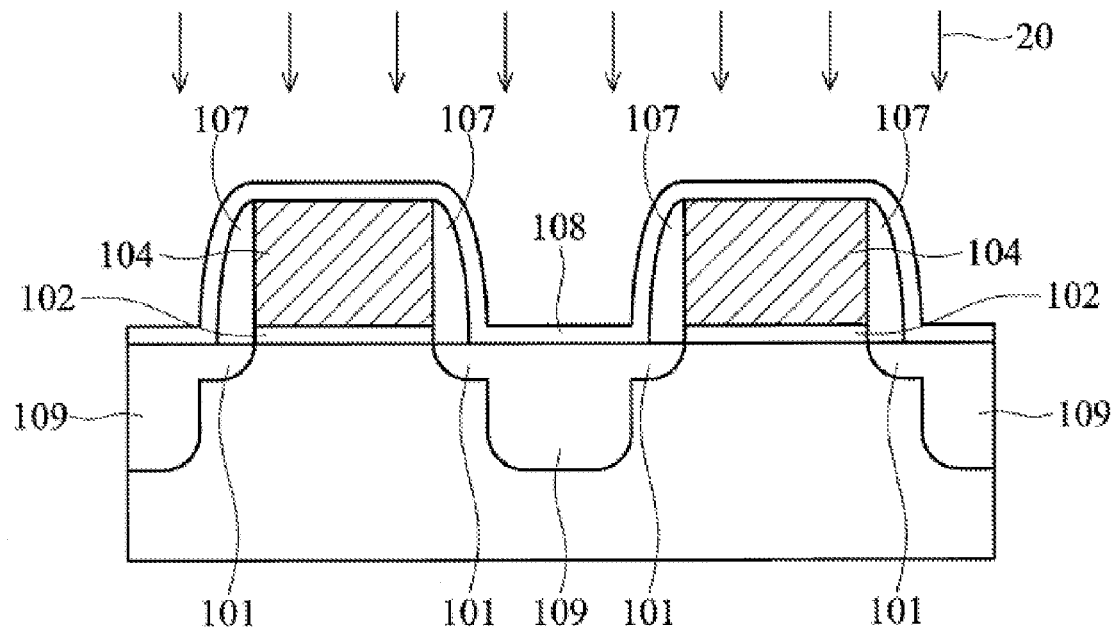

In FIG. 2D, a sacrificial liner 108 with a thickness of about 30 Å to 50 Å is conformally deposited on the upper surfaces of the substrate 100, the gate spacers 107 and the gate electrodes 104. The sacrificial liner 108 may comprise silicon oxide, silicon nitride, or silicon oxynitride and be formed by chemical vapor deposition (CVD) or other conventional deposition. However, note that the dielectric layer 106 shown in FIG. 2B has an etching selectivity relative to the sacrificial liner 108. In this embodiment, for example, the dielectric layer 106 for formation of gate spacers 107 comprises silicon nitride and the sacrificial liner 108 comprises silicon oxide. Since an etch chemistry for anisotropically etching silicon nitride is typically based on hydrogenated carbon fluorides, non-protected top surfaces of the gate electrodes 104 and the substrate 100 are etched. Consequently, a thin oxide liner (not shown) may be optionally formed on the surfaces of the substrate 100 and the gate electrodes 104 by oxidation or deposition, prior to the deposition of the silicon nitride layer for formation of gate spacers. In some embodiments, the dielectric layer 106 for formation of gate spacers 107 may comprise silicon oxide and the sacrificial liner 108 may comprise silicon nitride. After formation of the liner 108, ion implantation 20 is performed on the substrate 100 to form heavily doped regions 109 in the substrate 100, serving as source/drain regions. Since the sacrificial liner 108 covering the gate spacers 107 may act as a second gate spacer to increase the total spacer width, the source/drain regions 109 are substantially self-aligned with the sacrificial liner 108 on the corresponding gate spacers 107, respectively.

Figure 2E:
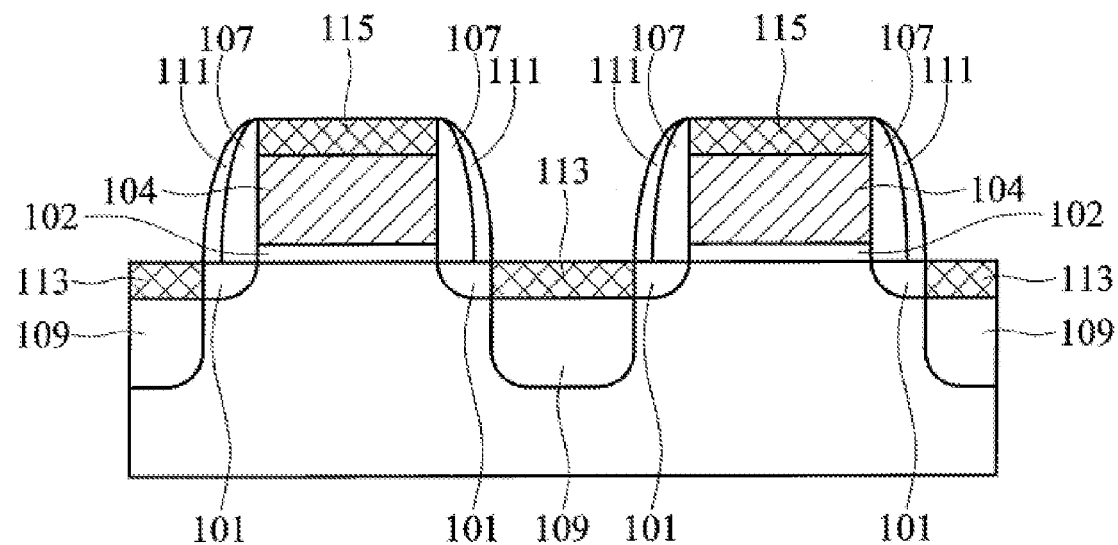

In FIG. 2E, the sacrificial liner 108 on the upper surfaces of the gate electrodes 104 and the source/drain regions 109 are removed by etching. For example, anisotropic etching, such as reactive ion etching (RIE), is performed on the sacrificial liner 108 to form second gate spacers 111 over the gate spacers 107 and expose the upper surfaces of the gate electrodes 104 and the source/drain regions 109. Additionally, optional wet etching may be performed after liner 108 etching, to remove any oxide from the upper surfaces of the gate electrodes 104 and the source/drain regions 109, if a thin oxide liner is formed on the surfaces of the gate electrodes 104 and the substrate 100 prior to formation of nitride gate spacers 107. A metal layer (not shown), such as a cobalt, nickel, titanium or tungsten layer, is subsequently formed on the surfaces of the exposed substrate 100, the exposed gate electrodes 104 and the gate spacers 107 and 111. The metal layer is heated, such that the metal reacts with the silicon to form metal silicide layers 113 and 115 on the upper surfaces of source/drain regions 109 and gate electrodes 104, respectively. After formation of the metal silicide layers 113 and 115, the metal layer is removed.

Figure 2F:
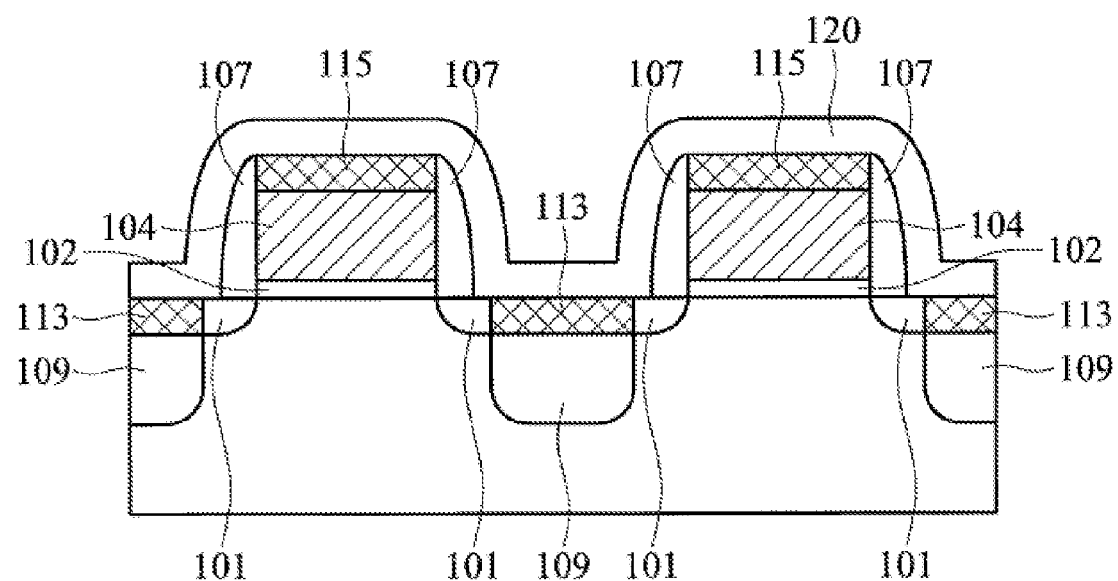
Figures 1, 2E:
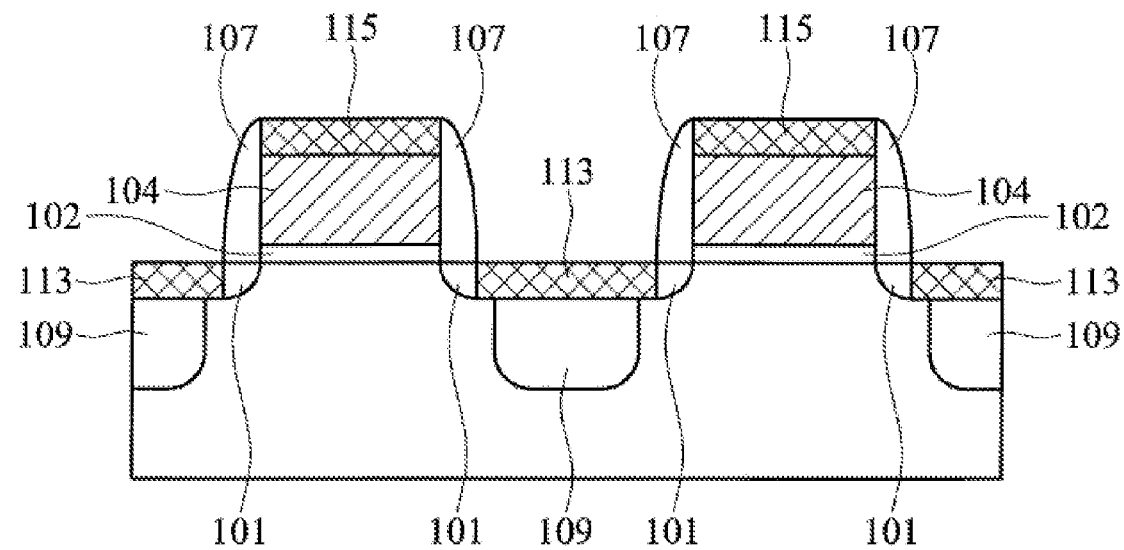
Figures 1, 2F:
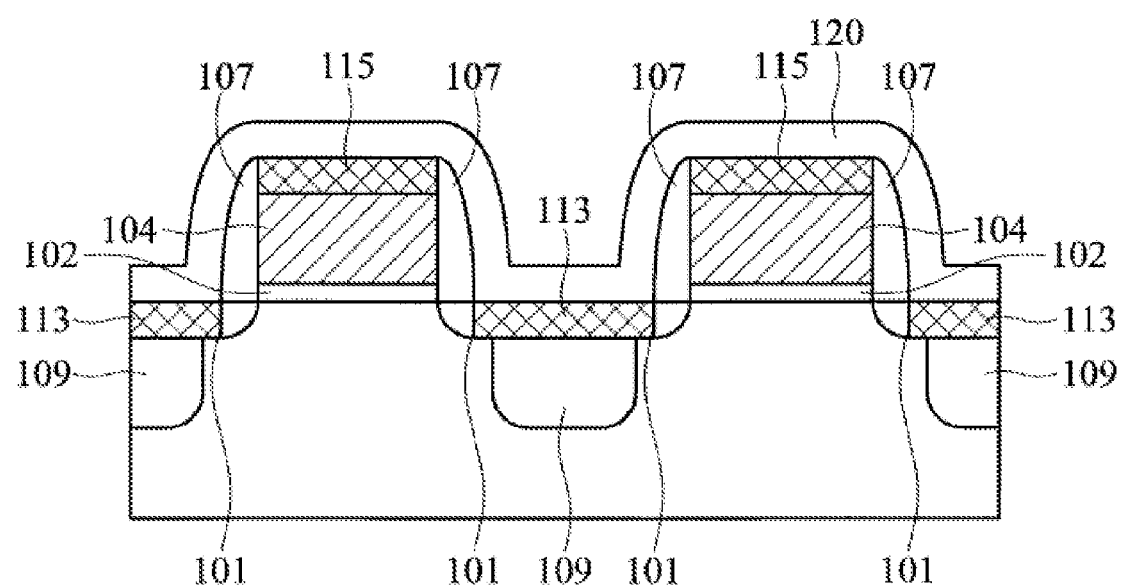

In FIG. 2F, the unnecessary gate spacer 111 is removed by, for example, wet etching. An etch stop layer 120 for subsequent contact etching is deposited on the source/drain regions 109 including metal silicide layers 113, the gate spacers 107 and the gate electrode 104 including metal silicide layers 115. In some embodiments, the gate spacers 111 can be removed prior to formation of the metal silicide layers 113 and 115. As a result, a semiconductor device including transistors or word lines with thin gate spacers is completed.

FIGS. 2E-1 to 2F-1 are cross sections of another embodiment of intermediate steps for fabricating the semiconductor device in FIG. 1. After formation of source/drain regions 109, as shown in FIG. 2D, the sacrificial liner 108 on the upper surfaces of the gate electrodes 104 and the source/drain regions 109 are completely removed by isotropic etching, to expose the upper surfaces of the gate electrodes 104 and the source/drain regions 109, as shown in FIG. 2E-1. Thereafter, a method similar to that disclosed is employed to form metal silicide layers 113 and 115 on the upper surfaces of source/drain regions 109 and gate electrodes 104, respectively.

In FIG. 2F-1, an etch stop layer 120 for subsequent contact etching is deposited on the source/drain regions 109 including metal silicide layers 113, the gate spacers 107 and the gate electrode 104 including metal silicide layers 115.

According to the invention, since a thinner gate spacer is provided on the sidewalls of the gate electrodes or word lines, gate spacer merge can be mitigated as semiconductor device size is reduced. That is, the gate spacer merge window can be increased. Accordingly, the thickness of the etch stop layer for contact etching can be increased to increase device performance. Moreover, since a thinner sacrificial liner is formed after formation of the gate spacer, effective spacer width can be increased, thereby mitigating lateral diffusion effect of source/drain regions and allowing the formation of deeper source/drain junction depth. Accordingly, SCE can be mitigated and the junction leakage induced by silicide reduced. Additionally, since the thinner sacrificial liner is removed prior to formation of the etch stop layer for contact etching, the spacing between gate electrodes is not reduced, thus the gate spacer merge window can be maintained.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a transistor, comprising:
providing a substrate having a gate electrode thereon and insulated therefrom;
forming a first gate spacer with a first dielectric material on the sidewalls of the gate electrode;
forming a liner with a second dielectric material on the upper surfaces of the substrate, the first gate spacer and the gate electrode, wherein the first dielectric material has an etching selectivity relative to the second dielectric material;
performing heavy ion implantation on the substrate to form source/drain regions in the substrate covered by the liner and substantially self-aligned with the liner on the first gate spacer, such that the source/drain regions are spaced from the sidewalls of the gate electrode; and
removing the liner from the upper surfaces of the gate electrode and the source/drain regions.

2. The method as claimed in claim 1, further comprising forming metal silicide on the upper surfaces of the gate electrode and the source/drain regions.

3. The method as claimed in claim 1, wherein the liner on the upper surfaces of the gate electrode and the source/drain regions is removed by anisotropic etching, to form a second gate spacer over the first gate spacer.

4. The method as claimed in claim 3, further comprising:
removing the second gate spacer by wet etching; and
forming an etching stop layer on the source/drain regions, the first gate spacer and the gate electrode.

5. The method as claimed in claim 1, wherein the liner is removed by isotropic etching to expose the upper surfaces of the source/drain regions, the first gate spacer and the gate electrode.

6. The method as claimed in claim 1, wherein the first dielectric material comprises silicon nitride and the second dielectric material comprises silicon oxide.

7. The method as claimed in claim 1, wherein the first dielectric material comprises silicon oxide and the second dielectric material comprises silicon nitride.

8. The method as claimed in claim 1, wherein the first gate spacer has a thickness of about 300 Å to 600 Å.

9. The method as claimed in claim 1, wherein the liner has a thickness of about 30 Å to 50 Å.

10. A method for fabricating a semiconductor device, comprising:
   providing a substrate having at least two conductive line elements thereon and insulated therefrom;
   forming first spacers with a first dielectric material on the sidewalls of the conductive line elements, respectively;
   forming a liner with a second dielectric material on the upper surfaces of the substrate, the first spacers and the conductive line elements, wherein the first dielectric material has an etching selectivity relative to the second dielectric material;
   performing heavy ion implantation on the substrate to form doped regions in the substrate covered by the liner and substantially self-aligned with the liner on the first spacers, respectively, such that the dosed regions are spaced from the sidewalls of the conductive line elements, respectively; and
   removing the liner from the upper surfaces of the conductive line elements and the doped regions.

11. The method as claimed in claim 10, further comprising forming metal silicide on the upper surfaces of the conductive line elements and the doped regions.

12. The method as claimed in claim 10, wherein the liner is removed from the upper surfaces of the conductive line elements and the doped regions by anisotropic etching, to form second spacers over the corresponding first spacers.

13. The method as claimed in claim 12, further comprising:
   removing the second spacers by wet etching; and
   forming an etching stop layer on the doped regions, the first spacers and the conductive line elements.

14. The method as claimed in claim 10, wherein the liner is removed by isotropic etching to expose the upper surfaces of the doped regions, the first gate spacers and the conductive line elements.

15. The method as claimed in claim 10, wherein the first dielectric material comprises silicon nitride and the second dielectric material comprises silicon oxide.

16. The method as claimed in claim 10, wherein the first dielectric material comprises silicon oxide and the second dielectric material comprises silicon nitride.

17. The method as claimed in claim 10, wherein the first gate spacers have a thickness of about 300 Å to 600 Å.

18. The method as claimed in claim 10, wherein the liner has a thickness of about 30 Å to 50 Å.

19. The method as claimed in claim 10, wherein the conductive line elements are word lines of a memory device.

\* \* \* \* \*